United States Patent [19]

Larson et al.

[11] Patent Number: 4,804,615

[45] Date of Patent: * Feb. 14, 1989

[54] METHOD FOR MANUFACTURE OF PRINTED CIRCUIT BOARDS

[75] Inventors: Gary B. Larson, Cheshire; Stanley J. Ruszczyk, Naugatuck; Steven A. Castaldi, Waterbury, all of Conn.

[73] Assignee: MacDermid, Incorporated, Waterbury, Conn.

[*] Notice: The portion of the term of this patent subsequent to Apr. 5, 2005 has been disclaimed.

[21] Appl. No.: 903,837

[22] Filed: Sep. 3, 1986

Related U.S. Application Data

[63] Continuation of Ser. No. 763,812, Aug. 8, 1985, abandoned.

[51] Int. Cl.$^4$ .................................. G03C 5/00
[52] U.S. Cl. .................................. 430/314; 430/318; 430/319; 430/329; 427/97; 427/98; 204/15; 156/659.1; 156/666
[58] Field of Search ............... 430/313, 314, 315, 318, 430/319, 329, 331, 325, 326, 312, 394; 204/15; 427/97, 98; 156/659.1, 666

[56] References Cited

U.S. PATENT DOCUMENTS

| | | | |
|---|---|---|---|
| 4,104,111 | 8/1978 | Mack | 156/656 |
| 4,291,118 | 9/1981 | Boduch et al. | 430/313 |
| 4,325,780 | 4/1982 | Schulz | 156/659.1 |
| 4,376,815 | 3/1983 | Oddi et al. | 430/313 |
| 4,487,654 | 12/1984 | Coppin | 156/645 |
| 4,735,694 | 4/1988 | Kukanskis | 204/15 |

OTHER PUBLICATIONS

Fefferman, "UV-Curable Solder Mask . . . ", Proc. Electr/Electron Insul. Conf., 1977, vol. 13, pp. 97-101.
Duffek, "PC Processing Using Solder Mask over Tin--Nickel", Electronic Packaging and Production, Jun. 1979, pp. 71-74.

*Primary Examiner*—José G. Dees
*Attorney, Agent, or Firm*—St.Onge Steward Johnston & Reens

[57] ABSTRACT

Printed circuit boards having solder coated pads and through-holes and bare copper traces protected by a directly applied solder mask or by a coating of non-reflowable metal and a solder mask thereover, are manufactured by a process which avoids the need for tin-lead stripping and the need for separate application and leveling of molten solder. In the preferred process, liquid resists are applied to circuit boards having tin-lead over copper plated holes and pads so as to define and etch-protect bare copper traces of desired pattern circuitry (as well as other desired configurations). Copper areas other than those protected by the etch-resist and tin-lead plating are etched away, the etch-resist removed and solder mask applied over the bare copper traces or other desired bare copper areas or, alternatively, to bare copper first coated with a non-reflowable metal. The tin-lead plating is then preferably reflowed and solidified to provide the pads and through-holes with solder coating.

12 Claims, 5 Drawing Sheets

METHOD FOR MANUFACTURE OF PRINTED CIRCUIT BOARDS

This is a continuation of co-pending application Ser. No. 763,812 filed on Aug. 8, 1985, abandoned.

BACKGROUND OF THE INVENTION

The present invention relates to printed circuit boards of the type having a solder mask over non-reflowable metal, such as bare copper traces etched on a suitable substrate, and, more particularly to a method of manufacture of such circuit boards and to the unique printed circuit boards resulting therefrom.

As is well understood in the art, the manufacture of double-sided printed circuit boards requires the provision of conductive through-holes for interconnecting components on opposite sides of the board. The non-conductive surfaces exposed when through-holes are drilled in a non-conductive substrate having metal cladding on both sides must, therefore, be provided with a conductive coating, and this generally is accomplished by a first electroless deposition of copper onto the suitably conditioned through-hole surfaces, followed by electroplating of copper to build up additional thickness.

In application of the actual circuit patterns to the metal-clad board surfaces, it is necessary to employ plating resists so as to prevent all but particular areas of the board (through-holes and/or traces and/or pads and/or other areas) from receiving applied metal platings such as the copper electroplate used in through-hole plating or the commonly-employed tin-lead coating applied as an etch-resist preliminary to the step of etching away undesired metal down to the non-conductive substrate surface so as to form the appropriate conductive circuit pattern.

Apart from its use as an etch-resist, tin-lead is a preferred overplating for otherwise exposed copper areas on the circuit board so as to prevent oxidative degradation of the copper surfaces.

In the ultimate fabrication of a printed circuit board in which various components and connections are soldered, it is generally accepted that improved solderability of circuit pads and through-holes can be provided to the ultimate fabricator by having the manufacturer precoat these areas with a solderable metal, generally a tin-lead composite closely similar in composition to the solder actually used in the eventual soldering of components and connections. For applications where hand-soldering by the fabricator is to be performed, little difficulty is encountered in applying solder to desired areas without disturbing or inadvertently soldering adjacent conductive traces. However, when soldering is to be conducted in mass techniques, such as with wave soldering or dip soldering methods, inadvertent soldering and improper connections can occur. As a consequence, manufacturers apply a solder resist or solder mask over those areas of the board to be protected from solder, including the tin-lead coated copper traces.

It has been recognized that the technique of solder resist over tin-lead coated copper can, however, lead to its own peculiar problems. For example, since the tin-lead is a reflowable metal, ultmate wave or dip soldering can cause the tin-lead to wick up under the mask or simply to melt and no longer provide support for the mask. Due to these disadvantages, it has been proposed to apply the solder mask directly over bare copper at those areas where protection from solder is desired. This "solder mask over bare copper" (SMOBC) technique avoids the problems inherent in the application of the mask over tin-lead coated copper, and can yield printed circuit boards with finer line definition and higher current density capabilities. Unfortunately, the known solder mask over bare copper techniques involve added manufacturing operations, and hence added cost, and present waste disposal and pollution control problems.

In order to explain these disadvantages in more detail, a typical SMOBC process is schematically set forth in the cross-sections represented by FIGS. 1A through 1J. Layer thicknesses and through-hole sizes are not representative of either actual or relative scale. For ease of representation of the various steps in the process, a section of the printed circuit board is shown involving, on each side, one through-hole, one pad, and one trace line; the trace will be in association with a different pad and through-hole area on the board (not shown), while the through-hole and pad will be associated with a different trace on the board (not shown).

As shown in FIG. 1A, a non-conductive substrate 10, typically an epoxy glass resin, has applied to it on both sides thin copper foil laminate 12. A through-hole 14 has been drilled in the laminated board, and the inner hole surfaces are thus composed of the non-conductive substrate.

In order to provide a conductive connection between the circuitry eventually applied on both sides of the laminate, the through-hole surfaces must be made conductive. As shown in FIG. 1B, the first step in this process is to electrolessly deposit a copper layer 16 on the entirety of the board, i.e., on the through-hole surfaces and on the copper foil 12 (conditioning and activating steps preliminary to copper deposition not shown).

The desired circuit pattern is then applied to the electroless copper layer through application and subsequent exposure and development of a negative photoresist. The areas of the photoresist exposed to light cross-link and become insoluble to developers which remove non-exposed, non-cross-linked areas. As a consequence, there are now present on the elctroless copper layer, exposed copper areas corresponding to traces, pads and through-holes, while remaining areas are covered by material 18 resistant to subsequent plating, as shown in FIG. 1C.

In the next step in the process, copper thickness in the exposed areas is built up through an electroplated copper layer 20 to arrive at the configuration shown in FIG. 1D.

Following copper electroplating, an etch resist 22, generally tin-lead, is electroplated onto exposed copper surfaces as depicted in FIG. 1E. After completion of this step, the plating resist 18 is removed (FIG. 1F) in preparation for copper etching, the etching resulting in the configuration shown in FIG. 1G.

Since the solder mask is to be applied to bare copper, the tin-lead etch resist 22 is stripped away in the next step as shown in FIG. 1H. It is now desired to solder coat the pads and through-holes but not the traces and, accordingly, a solder mask 24 is applied to the board in a pattern appropriate to protect all areas where solder is undesired, as shown in FIG. 1I. Thereafter, the exposed copper at the holes and pads is cleaned and prepared for solder coating, and then solder coated by, e.g., hot air level solder to present the solder-coated surface 26 as shown in FIG. 1J. Electrolytic processes for application of a solder coat cannot be employed in this method at this stage since the prior step of copper etching has removed the electrical continuity among areas of the board.

As will be readily apparent, the known techniques for solder mask over bare copper, while effective for eliminating problems inherent in application of solder mask to tin-lead coated copper, involve a number of steps which on their face appear almost duplicative but which nevertheless are necessary to gain the advantages of SMOBC. In particular, it will be seen that tin-lead is applied in the normal course of manufacture as an etch-resist over surfaces such as traces, pads and holes, and this tin-lead etch-resist is generally of the same or similar alloy composition as the solder eventually applied to the pads and holes. Nevertheless, the manufacturing sequence requires that this tin-lead etch-resist be stripped and removed so that effective solder masking of bare copper traces can be accomplished. Not only do these additional steps result in increased manufacturing cost, but significant waste removal and pollution concerns arise. Still further, truly flat solder surfaces are difficult to obtain even using hot air leveling.

SUMMARY OF THE INVENTION

It is an object of the present invention to provide printed circuit boards of the type in which a solder mask is present directly over bare copper surfaces where soldering is undesired and/or directly over a non-reflowable metal coated on bare copper surfaces.

A further object of the invention is to provide a process for manufacturing boards of the type described which is economical in execution and eliminates problems present in known processes as to waste disposal.

A more particular object of the invention is to provide printed circuit boards, and methods for their manufacture, of the type containing solder-coated pads and through-holes, and bare copper traces having a directly-applied solder mask thereon.

Still another object of the invention is to provide printed circuit boards, and methods for their manufacture, of the type having solder-coated pads and through-holes, bare copper traces having solder mask directly applied thereon, and additional bare copper surface configurations for application of other components and structures.

These and other objects are achieved through a unique method of manufacturing printed circuit boards in which tin-lead is selectively plated only onto those surfaces requiring both resistance to etching and subsequent solder coating. A liquid positive or negative resist is employed as an etch resist for those copper areas where eventual solder coating is not desired, and a solder mask is applied either directly over these bare copper areas after etching and removal of the resist or directly over a non-reflowable metal which has been coated onto the bare copper areas. The desired solder coating of surfaces of the printed circuit board is present simply by reason of the previously-applied tin-lead etch resist, which tin-lead coating can, if desired, be reflowed.

The method of the invention eliminates the need for stripping away of tin-lead etch resist and the need for subsequent application and leveling of molten solder.

According to the present invention, a non-conductive substrate material of the type commonly employed for printed circuit boards is provided with through-holes and pads which surround the surface openings to the through holes. The hole surfaces and the pad surfaces are built up of copper over which is applied a tin-lead plating. Other surfaces of the non-conductive substrate are built up solely with copper, resistance to tin-lead plating being conferred by a suitable resinous plating resist which is applied to those copper surfaces, including those areas of the copper surface where traces or other surface configurations eventually will be patterned, and then stripped off after tin-lead plating is applied to pads and holes. With the board in this configuration, a resinous material resistant to copper etching solutions is applied to the copper surfaces in a pattern which defines the traces and any other desired surface configurations, while at the same time protecting them from copper etching. Resistance to copper etching already is conferred to pads and holes by reason of the previously-applied tin-lead plate. Any exposed copper is then etched away down to the surface of the non-conductive substrate and the etch resist removed so as to expose bare copper in the desired pattern of traces and any other areas (e.g., lands for surface mount devices, bases for shield cans) desired. At this point, solder mask may be applied directly over (at least) the bare copper traces or, alternatively, a non-reflowable metal coating can first be applied to at least the traces, followed by application of the solder mask over at least the non-reflowable metal. The pad and hole areas containing tin-lead plating are not so masked, and thus present the desired solder coating without any need for tin-lead stripping and separate solder application. As usually will be the case, the tin-lead coating on the pads and holes preferably will be reflowed and solidified for provision of the desired solder coat.

As will be apparent, the method of the invention eliminates the need for tin-lead stripping because tin-lead is applied only to those areas (pads, through-holes) which eventually are to be provided with solder coating. The need for tin-lead plate on traces (which must be removed so as to permit solder mask over bare copper) is eliminated by utilization of resinous organic resist materials as the etch-resist for these areas. Through use of liquid resists for conferring etch-resistance to traces and other desired areas, close conformance to the topography of the surfaces to be protected is attained.

In order to more clearly describe the inventive method and its advantages, there is first presented in the following sections a detailed step-wise explanation of a preferred embodiment of the process, followed by discussion of particular features, parameters, substitutions, alternatives and the like.

BRIEF DESCRIPTION OF THE DRAWINGS

As previously noted.

Figure 1A:
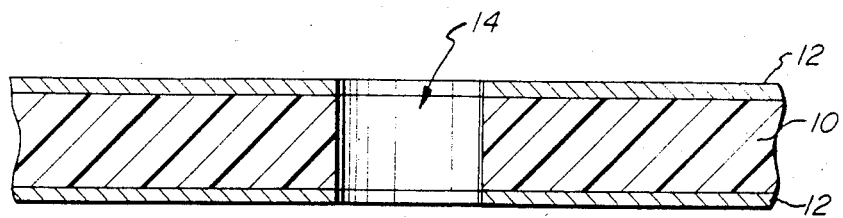
FIGS. 1A through 1J represent schematic illustrations of a circuit board cross-section during its various stages in a known solder mask over bare copper manufacturing method.
Figure 1B:
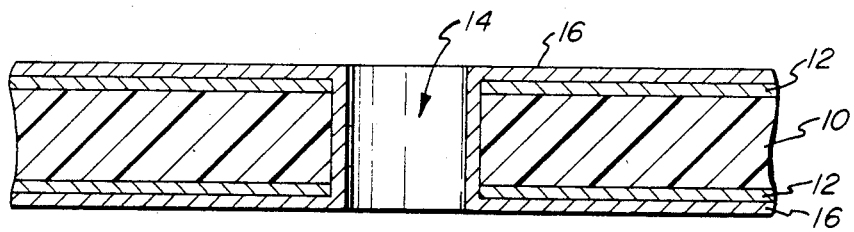
Figure 1C:
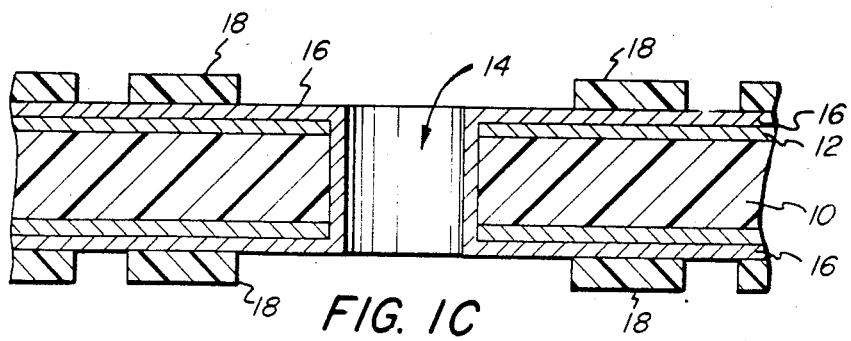
Figure 1D:
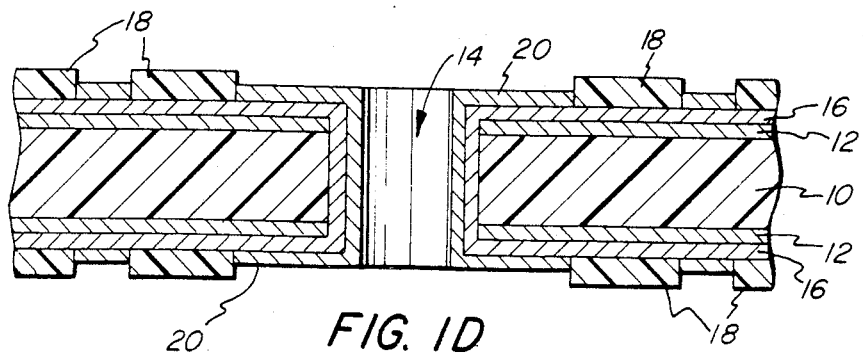
Figure 1E:
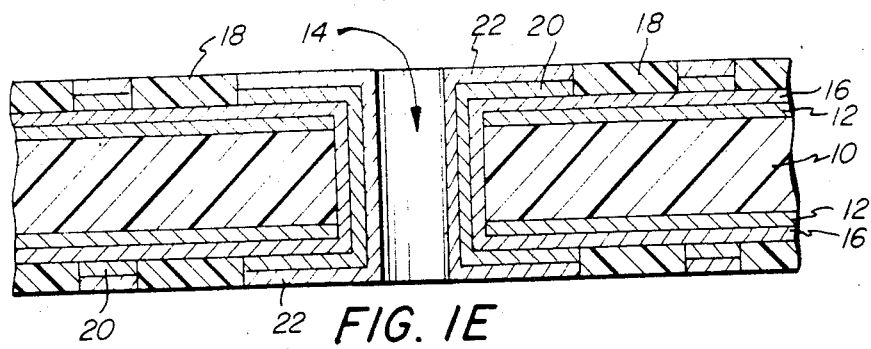
Figure 1F:
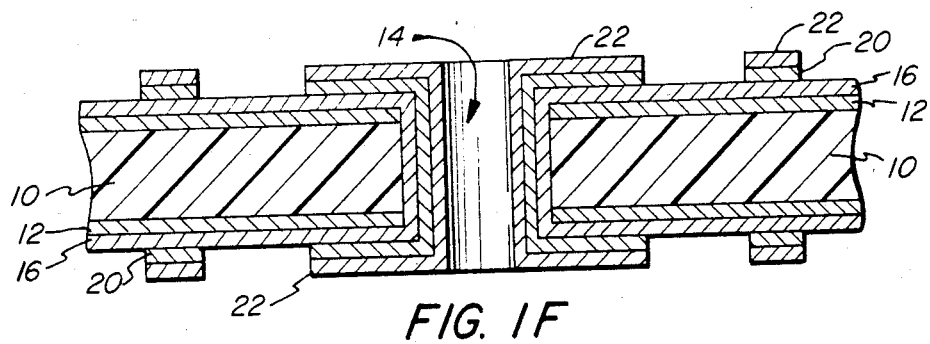
Figure 1G:
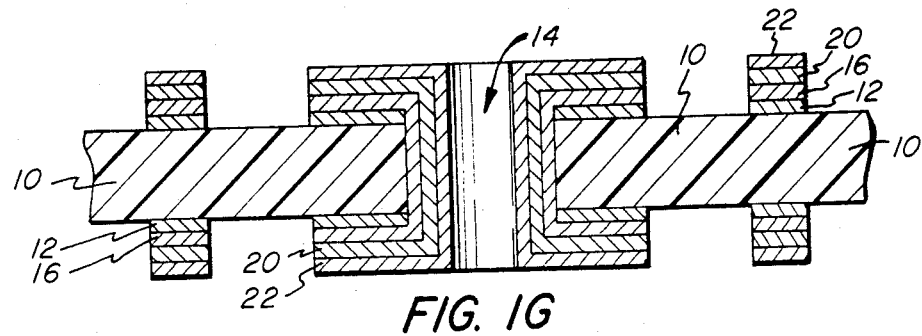
Figure 1H:
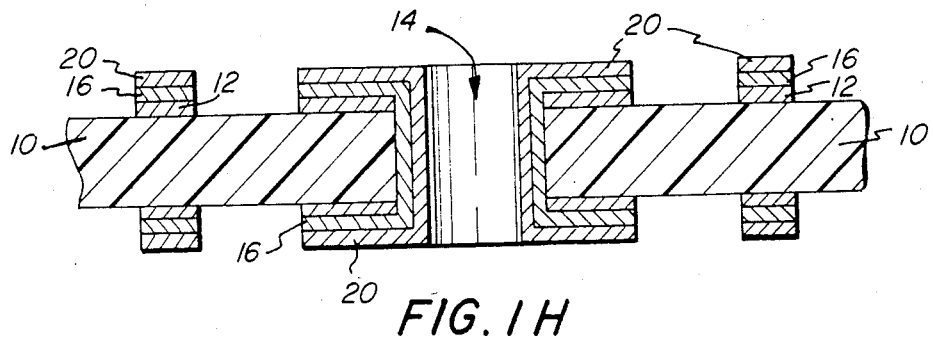
Figure 1I:
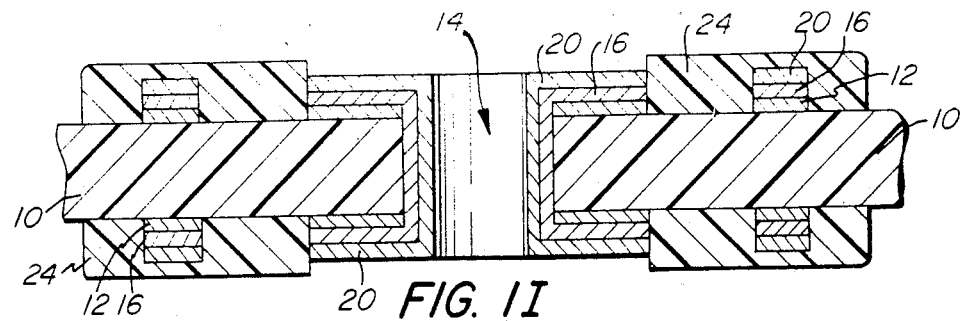
Figure 1J:
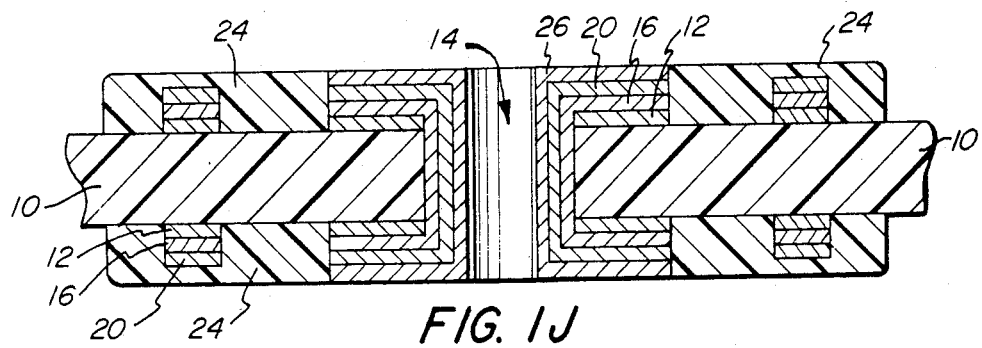

In like manner, FIGS. 2A through 2J schematically illustrate by cross-section the manufacturing method of the present invention, there again being no attempt to accurately represent relative layer thicknesses, hole sizes, etc. Also as in the earlier figures, the depicted hole and pad areas are associated with traces (not shown) other than those shown, and the depicted traces are associated with holes and pads (not shown) other than the depicted hole and pads.

DETAILED DESCRIPTION OF THE INVENTION

Referring to FIGS. 2A through 2J, the method of the invention makes use of a conventional non-conductive substrate 100, typically having a nominal thickness of 0.059 inches, containing through holes 140, and having copper foil 120 laminated on both sides of the substrate (FIG. 2A), generally in an amount to provide a coverage of about one ounce of copper per square foot on each side (0.0014 inches in thickness). The copper foil surfaces 120 and the exposed non-conductive through hole surfaces are then treated according to any known electroless copper depositing process (including the various conditioning, activating, accelerating, rinsing steps involved in conditioning the surfaces and securing suitable deposition) to deposit a copper layer 160 thereon (FIG. 2B), generally of about 40 to $120 \times 10^{-6}$ inches in thickness.

Figure 2A:
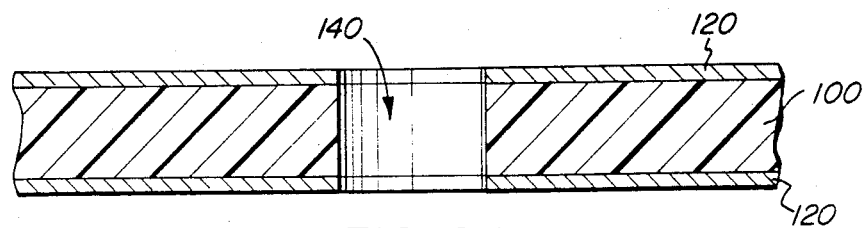
Figure 2B:
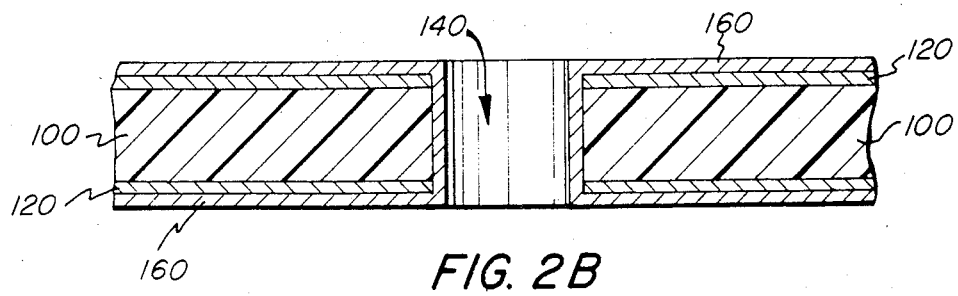
Figure 2C:
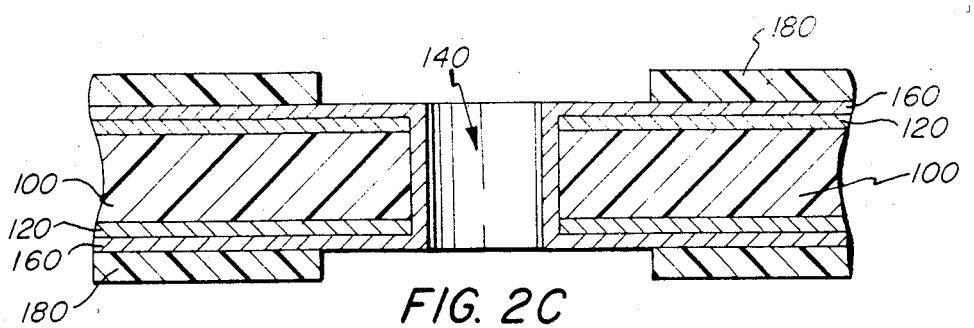

Because the board will undergo various plating processes, a plating resist 180 of suitable pattern is applied to the electroless copper surfaces. Generally, the resist will be of the photosensitive type (negative or positive-acting) and can be of the dry film or liquid type. Dry film resists typically will be employed where it is desired that certain through-holes receive no further coatings, since the dry film will easily tent over and protect these holes. Preferably, the resist will be a negative photoresist in which exposure to light results in insolubilization (cross-linking) of the resist material, while those areas not exposed to light remain in a form which permits dissolution and removal with a suitable developer. After application, exposure and development, the plating resist on the copper layer will be as shown in FIG. 2C. In particular it will be noted that pads and through-holes are exposed in this configuration while areas of the board where traces eventually will be applied are protected by the resist.

Figure 2D:
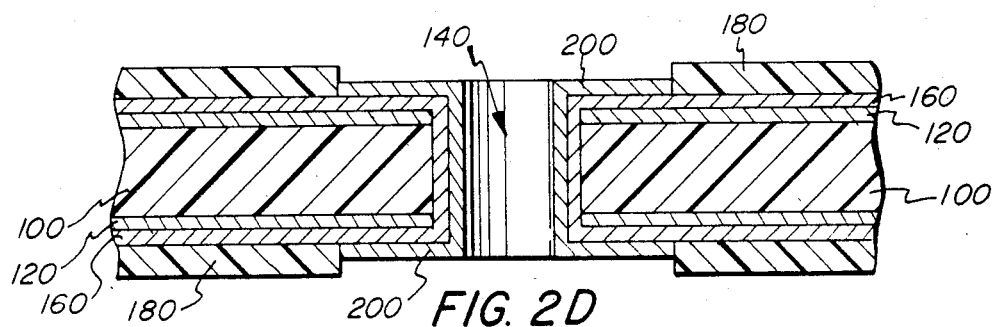
Figure 2E:
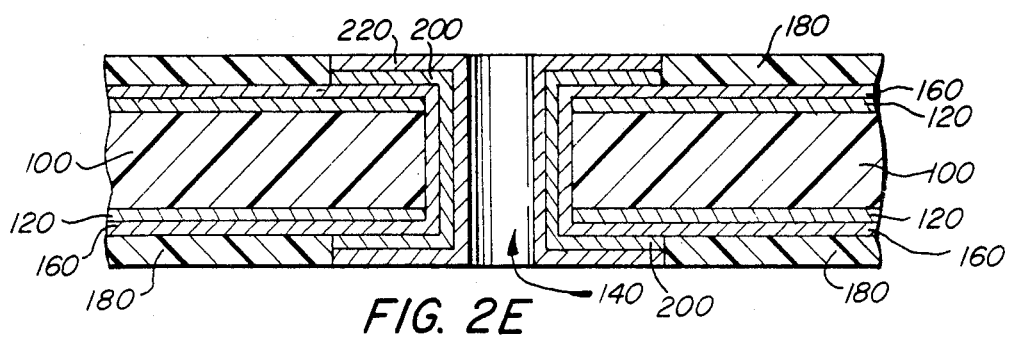
Figure 2F:
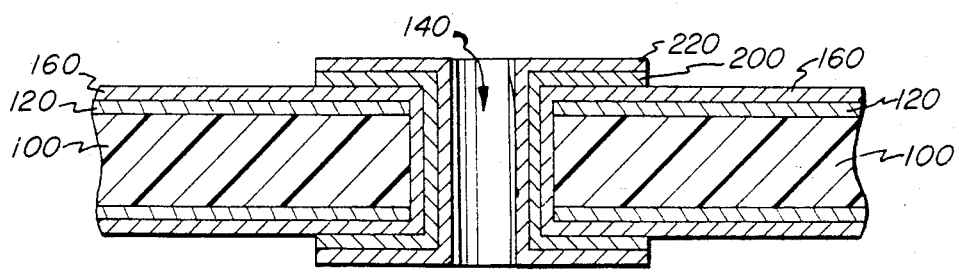

The pads and holes, which are not protected with plating resist material, are then provided with an electroplated copper coating 200, (generally about 0.001 inches thick) as shown in FIG. 2D, utilizing any known plating technique and bath suitable for such purpose. A tin-lead alloy 220, suitable both as an etch-resist and as the eventual solder coating for the through-holes and pads, is then electroplated onto the exposed pad and hole surfaces as shown in FIG. 2E, generally to a thickness of about 0.0003 inches. After tin-lead plating, the plating resist 180 is removed to provide a board as shown in FIG. 2F.

Figure 2G:
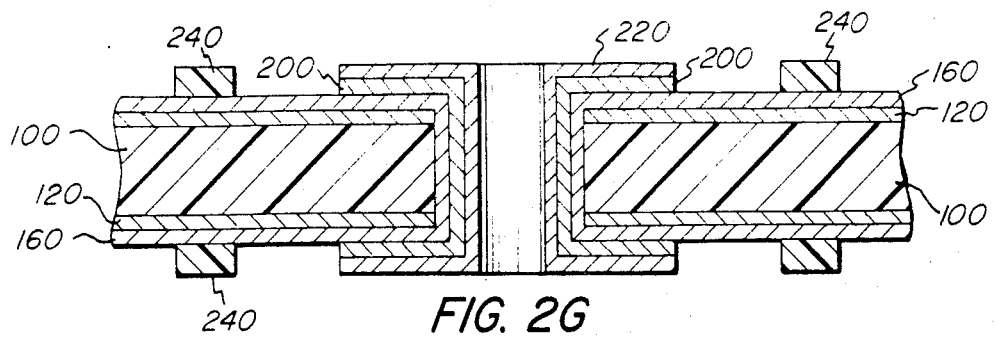
Figure 2H:
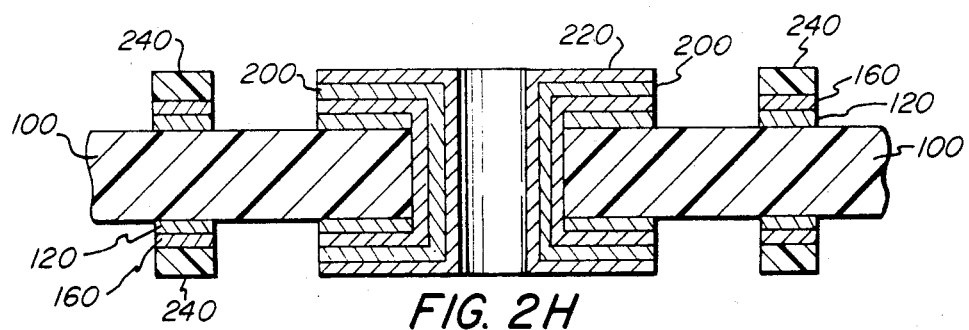

At this point in the process, a liquid photosensitive resist, which may be either a negative or positive resist, is applied to the surfaces 160 and exposed and developed in a suitable manner to leave on the surfaces 160 resist material in the configuration of the trace pattern. For negative resists, the trace pattern is in the form of exposed, cross-linked resist, while unexposed, non-cross-linked areas are removed. For positive resists, the trace pattern is in the form of unexposed, insoluble resist, while exposed, solubilized portions are removed. The configuration of the board with the applied, exposed and developed resist 240 is schematically shown in FIG. 2G.

Figure 2I:
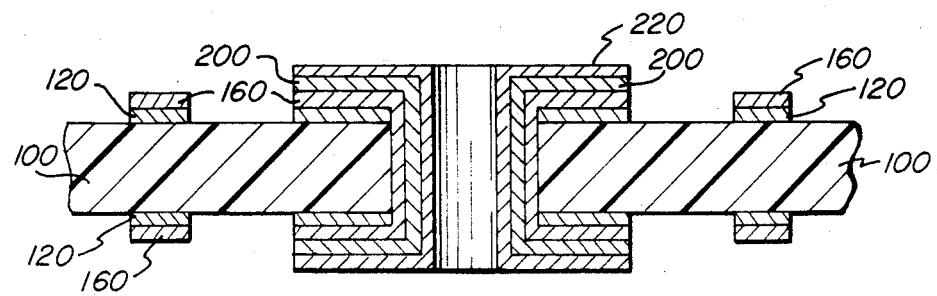
Figure 2J:
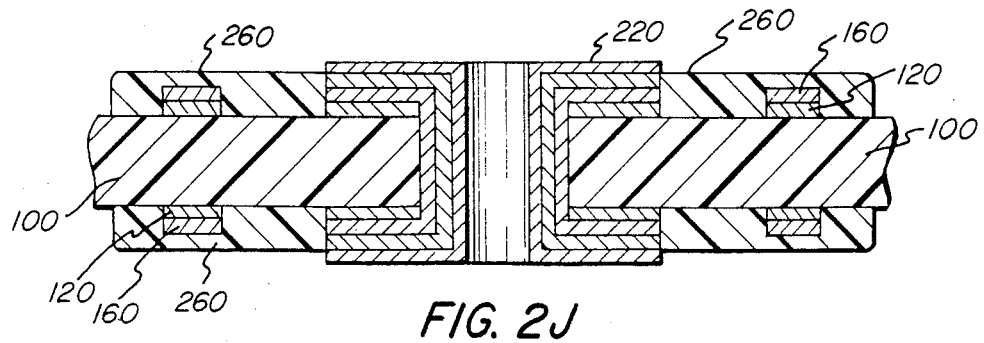

As will now be apparent, traces are now protected by the resist 240 while the pads and holes already have been plated with etch-resistant tin-lead 220. At this stage in the method of manufacture, exposed copper areas are removed with a suitable copper etchant to which the etch resist and tin-lead coating are resistant to arrive at the configuration shown in FIG. 2H. The resist 240 is then stripped away to expose the bare copper traces as shown in FIG. 2I. A solder mask 260 is then applied over the bare copper traces and other areas to be protected from solder (FIG. 2J). In practice, for ease of application and for conferring improved insulation resistance to the non-conductive substrate, the entire board will be solder masked except those areas (pads, holes) where solder is desired. The pads and through-holes are then "provided" with solder simply by the presence thereon of the previously-applied tin-lead etch resist 220. If desired, this tin-lead coating can be reflowed and solidified as known in the art to provide the solder coating.

The method of manufacture according to the present invention provides all the advantages of solder mask over bare copper techniques, while greatly simplifying the process, eliminating need for stripping of tin-lead, eliminating concern over waste disposal, and eliminating need for application and leveling of molten solder as the means for providing pads and through-holes with solder coat.

Although the method of the present invention has been specifically described with respect to solder mask over bare copper type printed circuit boards, it also is possible to first apply a non-reflowable metal to the "to-be-solder-masked" bare copper (as well as to certain other copper areas which will not be solder masked) and then apply the solder mask directly over certain areas where the non-reflowable metal has been provided. This method of manufacture has the advantage of providing the copper with improved corrosion resistance and improved solderability characteristics (for those areas which are not solder masked where subsequent component connections will take place), while still retaining all the advantages of solder mask over bare copper (as compared to solder mask over tin-lead) and, relative to other SMOBC methods, all the advantages of the present inventive manufacturing method. Thus, since the coating applied to the bare metal to be solder masked is a non-reflowable metal, the wicking and other problems encountered when solder mask is aplied over tin-lead are avoided. Moreover, since the bare copper areas coated by non-reflowable metal are arrived at without any need for tin-lead application and stripping, the method exhibits all the earlier-discussed advantages over prior art SMOBC techniques.

Suitable non-reflowable metals are those metals or metal compositions whose melting point is above the temperatures at which any operations subsequent to their application will occur. Among the non-reflowable metals other than copper which can be used according to this mode of processing are immersion tin coatings, electroless nickel-boron coatings and immersion gold coatings.

The various procedures and materials employed in the manufacturing method of the present invention are all known and used for the same or related individual purposes in the art. The non-conductive substrate generally will be an epoxy glass resin although other resinous materials such as phenolic resins and polyimide may also be employed. The composite board, i.e., non-conductive substrate clad on both sides with copper film is readily available from manufacturers in such form.

As will be seen in the method of the invention, the bare copper traces which form the circuitry on the surface of the finished board may (for example as in the previously described detailed embodiment) consist (in terms of copper) only of the original copper foil provided on the starting board and the layer of electrolessly deposited copper. As a consequence, where the traces are required to be of particular thickness for given applications, such thickness may be obtained by use of copper foil of sufficient thickness such that the overall thickness in conjunction with the later electroless copper plate is of the desired specification, or by any other suitable method. Typically the starting boards are provided with at least about 0.5 ounces of copper foil per square foot on each side, and most preferably at least about 1.0 ounce of copper foil. In the present invention, electroless copper coatings of from about 40 to $120 \times 10^{-6}$ inches generally will be employed with the aforementioned thicknesses of copper foil. As noted, the electroless copper deposition may be effected in any of the known manners using, for example, formaldehydereduced baths and the typical preliminary surface treating and catalytic activation sequences.

Application of a suitable pattern for the plating resist according to the invention can be effected by means of any of the known resist materials, including the known organic photoresists, and, as to these, can be employed with either positive or negative resists, dry film or liquid type. The desired result is simply application to all areas of the electrolessly copper coated board of a material which will resist coating in subsequent plating steps, i.e., copper electroplating and tin-lead electroplating. In the method of the invention, these areas include trace precursor areas, i.e., those areas at which the traces subsequently will be patterned.

For ease of processing and application, negative photoresist films are preferred, and a host of suitable such resist materials are known in the art. The films chosen are those of a thickness generally equal to the final plating thickness in the unprotected areas so that mushrooming of the plating coat can be minimized. Suitable negative films are the Riston-series from duPont, Dynachem Laminar and Hercules Aquamer, all of which are three-ply systems in which the film is drawn on a polyester backing sheet and then covered with a protective polymer film removed before lamination to the board surfaces. Once applied, the films are exposed through a light mask exhibiting the desired artwork configuration. Exposure results in cross-linking of the resist material and unexposed areas can then be washed away in dilute solutions of, e.g., sodium bicarbonate.

Electroplating of copper and tin-lead in sequence to the areas of the board not protected with resist may employ any of the methods (e.g., pyrophosphate or copper sulphate baths for copper and tin fluoborate, lead fluoborate, fluoboric acid for the tin-lead) known and available in the art. Generally, the copper will be electroplated to a thickness of about 1 mil while the tin-lead alloy will be plated to a thickness on the order of about 0.4 mil. Following electroplating, the resist film is stripped away using any solvent suitable for the type film employed, e.g., caustic if a fully aqueous film was used or an organic material such as methylene chloride for semi-aqueous or solvent-strippable resists, in an immersion or spray technique.

At this stage in the manufacturing process, the board is now ready for subsequent processing so as to attain solder mask over bare copper traces (or over copper coated with non-reflowable metal), but without the need for the costly and problematical methods of the prior art. The key feature for achieving this goal is arranging on the required board areas a resinous material resistant to the subsequent copper etching. This preferably is attained by application, exposure and development of a liquid photoresist.

The use of a liquid positive or negative photoresist for this stage in the process is highly advantageous in terms of its ability to adhere and conform to the desired surfaces and its range of flexibility in building up a desired thickness. At the point in the process just prior to application of this resist, the topography of the circuit board is not perfectly level, and known commercially available dry films could either crack along the edges of the traces (leaving those areas exposed and unprotected during etching) or tent over areas which should be etched. Liquid resists can adhere to non-level surfaces and reduce or eliminate these problems. The liquid resists can be applied to the board surfaces in any of the techniques known in the art, such as spray coating, roller coating, curtain coating or screening.

Although either positive or negative liquid photoresists may be employed, each has certain characteristics which may make choice of one over the other expedient for certain applications. Each can conform and adhere to non-level surfaces and be applied to desired thickness. Positive resists have the advantage of being exposed and developed multiple times but, under some circumstances, plugging of through holes with positive liquid resists can occur. Thus, when positive liquid is used, the exposed areas are the areas which become solubilized and capable of being washed away, while the unexposed areas are those that remain as the etch resist. If in the course of application the liquid resist bleeds into a hole, the difficulty in exposing that bleed-in to light of proper exposure for solubilization can lead to resist residues remaining in the hole which could break down electrical connections. Liquid negative resists, on the other hand, have reduced sensitivity to this problem since negative resist which might bleed into a hole can be washed away, because it is exposure which insolubilizes the negative resist material.

As noted, the liquid resist may be applied according to any known method to produce a variety of coating thicknesses which will provide etch resistance to the covered areas (generally on the order of 0.3 to 0.4 mil). Screening using a standard squeegee and mesh sizes from 110 to 310 threads per inch are appropriate. After application, the liquid resist is post-baked for removal of solvent contained therein, after which the resist is exposed to light in appropriate patterns and developed in, e.g., aqueous alkaline solutions. Any suitable positive or negative liquid resist may be employed, such as PR 64 (MacDermid, Inc., Waterbury, Conn. (positive) and the 747 type microresists available from the Eastman Kodak Company (negative).

As a result of the application, exposure and development of the liquid resist, the resist remaining on the board surface defines and protects the traces in the board circuitry against subsequent etching, while pads and holes already are protected by their tin-lead coating. Etching away of the copper in unprotected areas can be conducted using standard processes and materials that do not attack the liquid resist or the tin-lead, such as alkaline, ammonium chloride-based etchants and acid hydrogen peroxide-based etchants such as hydrogenperoxide/sulfuric acid-based etchants, and the like.

After etching, the photoresist used to protect traces is stripped (e.g., using 20% caustic).

After stripping of the etch-resistant photoresist, solder mask may then be applied at least to the nowexposed bare copper traces. As noted, ease of application usually dictates that all areas of the board except those areas where solder is to exist (pads, holes) be solder masked and, indeed, solder mask on the dielectric substrate will generally improve its insulation resistance.

In an alternative embodiment of the invention, there is first applied to bare copper areas a non-reflowable metal coating such as an immersion tin coating, to improve the corrosion resistance of the copper and improve its solderability characteristics in later processing (for those areas which will not be solder masked, i.e., where subsequent component connections will take place). Solder mask is then applied over defined areas coated with non-reflowable metal, and, as earlier described, will generally be applied to all board areas except those where solder is to be present. In either case, the solder mask may be any of the known organic materials suitable for application to bare copper, nonreflowable metals and other board areas where protection from solder is required, such as Novolak epoxy cured using a methylene dianiline catalyst. After curing of the solder mask, the tin-lead coating on the pads and holes provides the requisite solder coating on these areas and, if desired, can be reflowed in conventional manner to render the deposit molten, accelerate alloying and produce a fused, dense, amorphous solder coat on solidification.

Apart from use of the method of manufacture of the present invention to provide printed circuit boards with solder mask over bare copper (or over non-reflowable metal generally) and solder plated pads and holes, additional surface configurations can be provided on the board using this method. In particular, the etch-resists used to define and protect copper traces can at the same time be patterned so as to define and protect other areas of the board surface, such as areas which serve as lands for surface mounted devices or bases for shield cans used for EMI-RFI shielding. Subsequent to copper etching and stripping of the resist, these areas exhibit an exceptionally flat copper surface (made up, e.g., of the copper foil and electrolessly deposited copper), highly suitable for effecting complete bonding and connections, and particularly, e.g., for surface mount devices. These copper-exposed areas generally will be protected with an electroless or immersion coating of non-reflowable metal (such as immersion tin), particularly if reflow of the tin-lead on the pads and through-holes is to be effected.

Although the present invention has been described with respect to particular features and embodiments, it will be apparent to those skilled in the art that various modifications and improvements may be made without departing from the scope and spirit of the invention, as defined by the appended claims.

What is claimed is:

1. A method for manufacturing printed circuit boards containing conductive through-holes, conductive pads and conductive traces forming a circuit pattern on said board, and wherein said pads and through-holes are provided with a solder coating and said traces, either as bare copper or bare copper coated with a non-reflowable metal, are provided with a solder mask, said method consisting of:
    (a) providing a non-conductive substrate material (1) having through-holes therein, the exposed surfaces of said through-holes consisting of a tin-lead plating over a previously-applied copper surface; (2) having pads surrounding the surface openings of said through-holes, the exposed surfaces of said pads consisting of a tin-lead plating over a previously-applied copper plating; (3) and having remaining areas on its surface consisting of copper coating;
    (b) arranging on at least some of said remaining areas consisting of copper coating but not on said through-hole and pad areas, an etch-resistant resinous material in the pattern of desired traces;
    (c) etching exposed copper coating from said substrate surfaces;
    (d) removing said etch-resistant resinous material so as to expose the pattern of desired bare copper traces; and
    (e) thereafter processing said circuit board by applying to at least said bare copper traces, but not to through-hole or pad surfaces, a coating of non-reflowable metal and thereafter applying solder mask over at least said non-reflowable metal, but not to through-hole or pad surfaces, so as to provide a circuit board having pads and through-holes provided with a solder coating and at least traces protected by a solder mask.

2. The method according to claim 1, wherein said etch-resistant resinous material in the pattern of desired traces is formed by application and light exposure of a liquid photosensitive material in the pattern of said desired traces, followed by removal of undeveloped resist material.

3. The method according to claim 1, wherein said etch-resistant resinous material in the pattern of desired traces is formed by application and light exposure of a negative type liquid photosensitive material and wherein areas thereof unexpected to light are removed.

4. The method according to claim 1, wherein said etch-resistant resinous materials in the pattern of desired traces is formed by application and light exposure of a positive type liquid photosensitive material, and wherein areas thereof exposed to light are removed.

5. A method for manufacturing printed circuit boards containing conductive through-holes, conductive pads surrounding said through-holes and conductive copper traces forming a circuit pattern on said board, and wherein said pads and through-holes are provided with a solder coating and said copper traces, either as bare copper or bare copper coated with a non-reflowable metal, are provided with a solder mask, said method comprising the steps of:
    (a) providing a circuit board material containing through-holes and pads surrounding the surface openings of said through-holes, said board consisting of a planar non-conductive substrate material having copper foil laminated to each side thereof, the areas defined by said through-holes consisting of layered coatings, radially inward to the center of said hole, of electroless copper, electroplated copper and electroplated tin-lead, the areas defined by said pads consisting of layered coatings, commencing from said non-conductive substrate surface, of copper foil, electroless copper, electroplated copper and electroplated tin-lead, and trace precursor areas on at least one surface of said non-conductive substrate consisting of layered coatings, commencing from said substrate surface, of coppor foil and electroless copper;

(b) applying, exposing and developing a liquid photosensitive material on said trace precursor areas but not on said through-hole and pad areas so as to define at least a trace pattern and provide said trace precursor areas, in said pattern, with a resinous material resistant to copper etching;

(c) removing copper from the areas of said circuit board not provided with etch-resistant resinous material or tin-lead coating, so as to expose said non-conductive substrate surfaces at those areas;

(d) removing said etch-resistant resinous material from said trace precursor areas to expose bare copper traces consisting of copper foil and electroless copper; and (e) thereafter processing said circuit board by applying to at least said bare copper traces, but not to the through-hole or pad surfaces, a coating of non-reflowable metal and there-after applying solder mask over at least said non-reflowable metal coated traces, but not to through-holes or pad surfaces, so as to provide a circuit board having pads and through-holes provided with a solder coating and at least traces protected by a solder mask.

6. The method according to claims 5 or 1, wherein said etch-resistant resinous material also is arranged so as to define and protect from etching, copper coated surfaces on said substrate other than traces.

7. The method according to claims 5 or 1, wherein said etch-resistant resinous material also is arranged so as to define and protect from etching, copper coated surfaces on said substrate corresponding to areas for mounting of surface mounted devices.

8. The method according to claims 5 or 1, wherein said tin-lead plating on pad and through-hole surfaces is reflowed and solidified after application of solder mask over at least said copper traces coated with non-reflowable metal.

9. A method for the manufacture of printed circuit boards containing through-holes, pads and traces, comprising the steps of:

(a) providing a planar non-conductive substrate having copper-foil laminated to both sides theroef and having through-holes made therein;

(b) electrolessly depositing a copper layer on the copper-foil and through-hole surfaces;

(c) applying a plating-resistant resinous material to areas of said laminated, coated substrate other than said through-hole surfaces and the areas defining pads surrounding the surfaces openings of said through-holes;

(d) subjecting said substrate to a copper electroplating process to deposit additional copper thickness on the electroless copper of said through-holes and pad surfaces;

(e) applying a tin-lead plating over the electroplated copper of said through-hole and pad surfaces;

(f) removing said plating-resistant resinous material from said copper foil/electroless copper surfaces;

(g) applying an etch-resistant resinous material to at least portions of said copper foil/electroless copper surfaces and not to said through-hole and pad surfaces to define a trace pattern therein and protect said surfaces from copper etching;

(h) removing copper foil and electroless copper from those areas not protected by said etch-resist or said tin-lead plating;

(i) removing said etch-resist to expose bare copper traces consisting of copper foil and electroless copper;

(j) applying to at least said bare copper traces, but not to the through-hole or pad surfaces, a coating of non-reflowable metal;

(k) applying a solder mask over at least said non-reflowable metal coated traces; and (l) reflowing and solidifying the tin-lead plating on pad and through-hole surfaces to provide thereon a solder coating.

10. The method according to claim 9 wherein said etch-resistant resinous material of step (g) results from application, exposure and development of a liquid photosensitive material to said copper foil/electroless copper srufaces.

11. The method according to claim 10 wherein said liquid photosensitive material is of the negative type.

12. The method according to claim 10 wherein said liquid photosensitive material is of the positive type.

* * * * *